(12) United States Patent
Hall et al.

(10) Patent No.: US 7,912,156 B1
(45) Date of Patent: Mar. 22, 2011

(54) DIGITAL COMMUNICATIONS METHOD AND SYSTEM FOR COMMUNICATING OVER CHANNELS WITH BLOCK FADING AND BURST JAMMING

(75) Inventors: Eric K. Hall, Sandy, UT (US); Ayyoob Abbaszadeh, Salt Lake City, UT (US); Thomas R. Giallorenzi, Riverton, UT (US)

(73) Assignee: L-3 Communications Corporation, New York, NY (US)

( * ) Notice: Subject to any disclaimer, the term of this patent is extended or adjusted under 35 U.S.C. 154(b) by 924 days.

(21) Appl. No.: 10/820,347

(22) Filed: Apr. 7, 2004

(51) Int. Cl.
  *H04L 27/06* (2006.01)
(52) U.S. Cl. ........ 375/341; 375/278; 375/284; 375/296; 375/346; 375/348
(58) Field of Classification Search .................. 375/267, 375/347, 341, 208, 278, 284, 296, 346, 348; 714/784, 782; 371/35
  See application file for complete search history.

(56) References Cited

U.S. PATENT DOCUMENTS

| | | | | |
|---|---|---|---|---|
| 4,574,252 A * | 3/1986 | Slack | ............................ | 330/281 |
| 4,718,066 A * | 1/1988 | Rogard | ......................... | 714/751 |
| 5,175,558 A * | 12/1992 | DuPree | ......................... | 342/378 |
| 5,960,039 A * | 9/1999 | Martin et al. | ................. | 375/267 |
| 5,966,401 A * | 10/1999 | Kumar | ........................... | 375/150 |
| 6,516,438 B1 * | 2/2003 | Wilcoxson et al. | ........... | 714/755 |
| 6,634,007 B1 * | 10/2003 | Koetter et al. | ................ | 714/784 |
| 2003/0043928 A1 * | 3/2003 | Ling et al. | ..................... | 375/267 |
| 2004/0174809 A1 * | 9/2004 | Shor et al. | ..................... | 370/206 |

OTHER PUBLICATIONS

"Design and Analysis of Turbo Codes on Rayleigh Fading Channels", Eric K. Hall et al., IEEE Journal on Selected Areas in Communicatins, vol. 16, No. 2, Feb. 1998, pp. 160-174.
"Turbo Decoding with Erasures for High-Speed Transmission in the Presence of Impulse Noise", Lliang Zhang et al., IEEE 2002, pp. 20-1-20-6.
"A Serial-Parallel Concatenated System: Construction and Iterative Decoding with Erasures", Jan Bajcsy et al., IEEE 1999, pp. 1192-1196.
"Soft-Decision and Erasure Decoding in Fast Frequency-Hopping Systems with Convolutional, Turbo, and Reed-Solomon Codes", IEEE Transactions on Communications, vol. 47, No. 11, Nov. 1999, pp. 1646-1654.
"A High Speed Successive Erasure BCH[1] Decoder Architecture", Thomas Buerner, Institute for Computer Aided Circuit Design, 2003, 6 pages.

* cited by examiner

*Primary Examiner* — Shuwang Liu
*Assistant Examiner* — Kabir A Timory
(74) *Attorney, Agent, or Firm* — Harrington & Smith

(57) ABSTRACT

Method and apparatus are disclosed for obtaining improved performance when using Forward Error Correction (FEC) with channels experiencing block fading or burst jamming over some number of contiguous symbols. One suitable application is when the channel is periodically obstructed due to the rotation of a propeller blade, resulting in a periodic block fading channel. During operation zero symbols are inserted into the received signal stream, prior to the FEC decoder at times that are estimated or otherwise determined to correspond to periods of jamming or severe fading. The zero symbols effectively "erase" the severely degraded symbols. The zero symbols are less detrimental to the FEC decoder than the severely degraded symbols, especially when the channel interleaving/de-interleaving operations result in the zero symbols being temporarily distributed over a large block of received symbols.

21 Claims, 15 Drawing Sheets

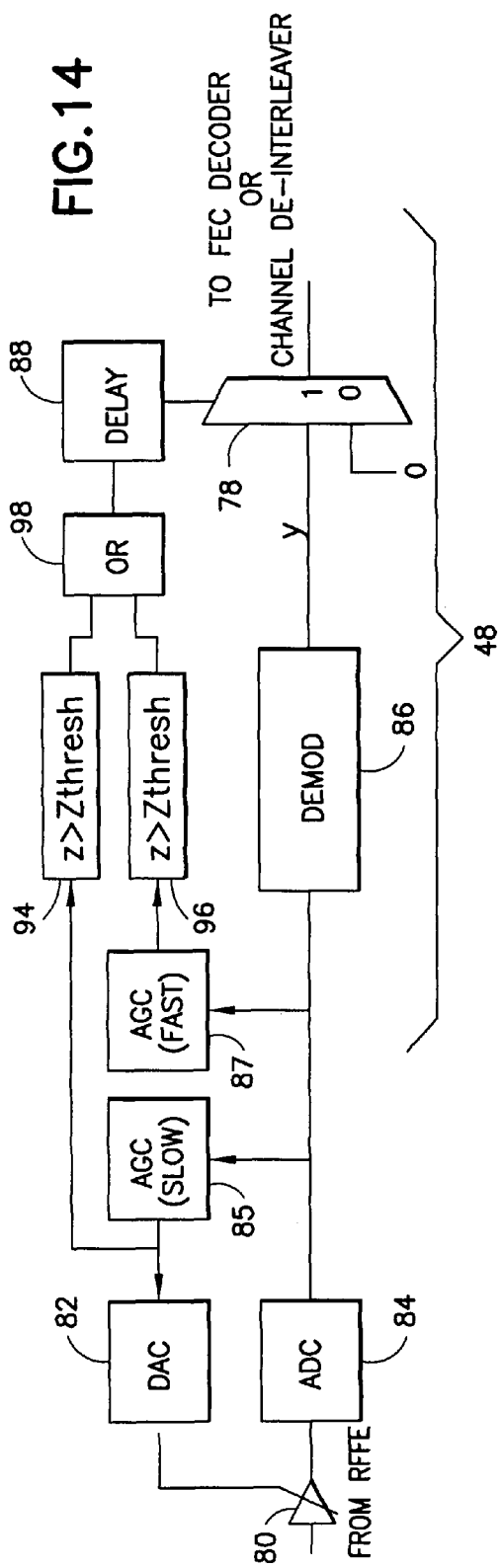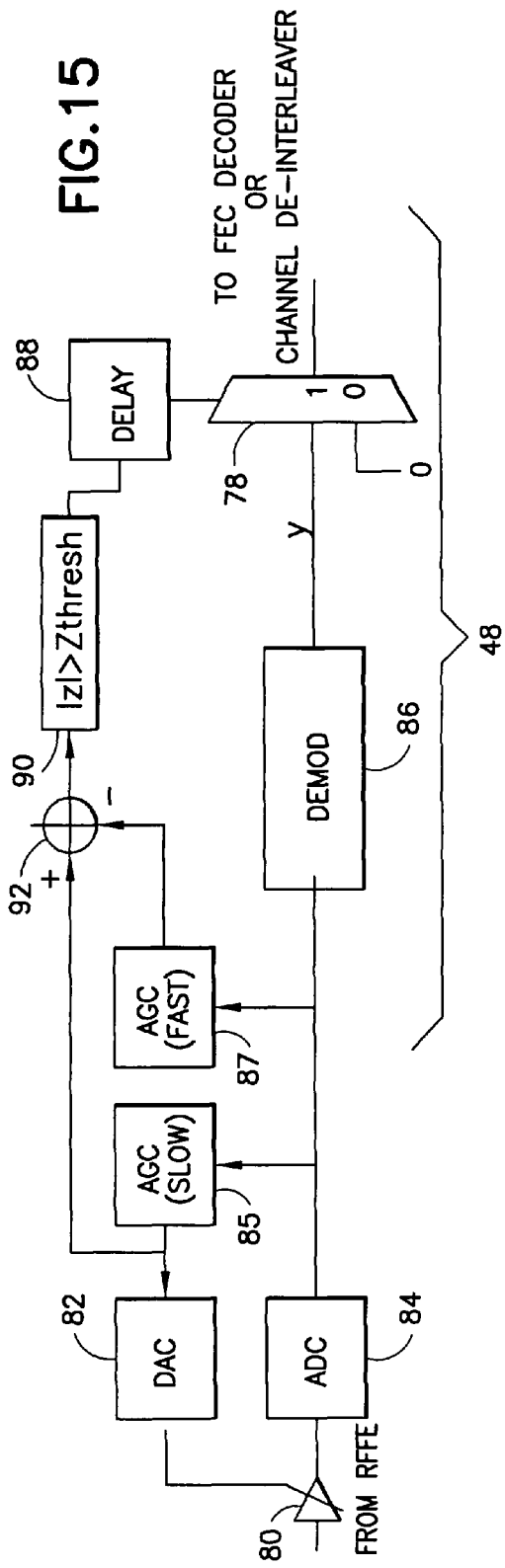

DIGITAL COMMUNICATIONS METHOD AND SYSTEM FOR COMMUNICATING OVER CHANNELS WITH BLOCK FADING AND BURST JAMMING

TECHNICAL FIELD

This invention relates generally to radio frequency (RF) digital communications systems and, more specifically, relates to techniques for reducing the adverse affects on a communications channel that is subject to intermittent, possibly periodic, block fading and/or burst jamming.

BACKGROUND

A digital communications channel can be subjected to both intentional jamming events and to the occurrence of deep fading events. Such events can occur randomly, or they can occur periodically. Typically, Forward Error Correction techniques, combined with interleaving, have been used to combat these types of channel impairments.

A particular problem is created when one attempts to transmit a signal through a channel that is periodically interrupted by some object, such as a rotating blade of a helicopter, as some number (e.g., tens) of contiguously transmitted symbols may experience the deep fade due to obstruction by the helicopter blade. In this case the conventional FEC combined with interleaving may be insufficient to ameliorate the adverse effects of the periodic deep fade, resulting in an unacceptable degradation in received signal quality. The same problems can arise when a transmitted signal is subjected to intentional or unintentional jamming.

SUMMARY OF THE PREFERRED EMBODIMENTS

The foregoing and other problems are overcome, and other advantages are realized, in accordance with the presently preferred embodiments of these teachings.

Disclosed herein is a technique for obtaining improved performance of digital communications channels using Forward Error Correction (FEC) when operating over channels with block fading or burst jamming. The channel of interest typically involves jamming or severe signal attenuation (e.g., fading) over some number of contiguous symbols of the transmission. One suitable, but non-limiting application, is related to the severe signal attenuation case that involves wireless communications between a helicopter and a satellite. In this application the channel is periodically obstructed due to the rotation of the helicopter blades, resulting in a periodic block fading channel.

In accordance with an aspect of this invention a concatenated FEC technique is used, such as RS-CC or Turbo Codes, in conjunction with channel interleaving. The receiver estimates or detects the block interference and uses this information during FEC decoding. For RS-CC, knowledge of the jamming or fading allows a declaration of erasures and improved RS decoding performance. For Turbo decoding, knowledge of the jamming or fading may also allow for erasures, or soft-input values that convey no information. It is shown that performance of Turbo decoding may be improved by several dB when this knowledge is incorporated into the decoding process.

In the preferred embodiment zero symbols are inserted into the received signal stream, prior to the FEC decoder, at times that are estimated or otherwise determined to correspond to periods of jamming or severe fading. The zero symbols effectively "erase" the severely degraded symbols. It is assumed that the presence of the zero symbols is less detrimental to the operation of the FEC decoder than the presence of the severely degraded symbols, especially in that the channel interleaving/de-interleaving operations result in the zero symbols being temporally distributed over a large block of received symbols.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 14 is a block diagram of a first embodiment of circuitry for providing AGC-based detection of severe block fading;

FIG. 15 is a block diagram of a second embodiment of circuitry for providing AGC-based detection of severe block fading;

DETAILED DESCRIPTION OF THE PREFERRED EMBODIMENTS

Figure 1:
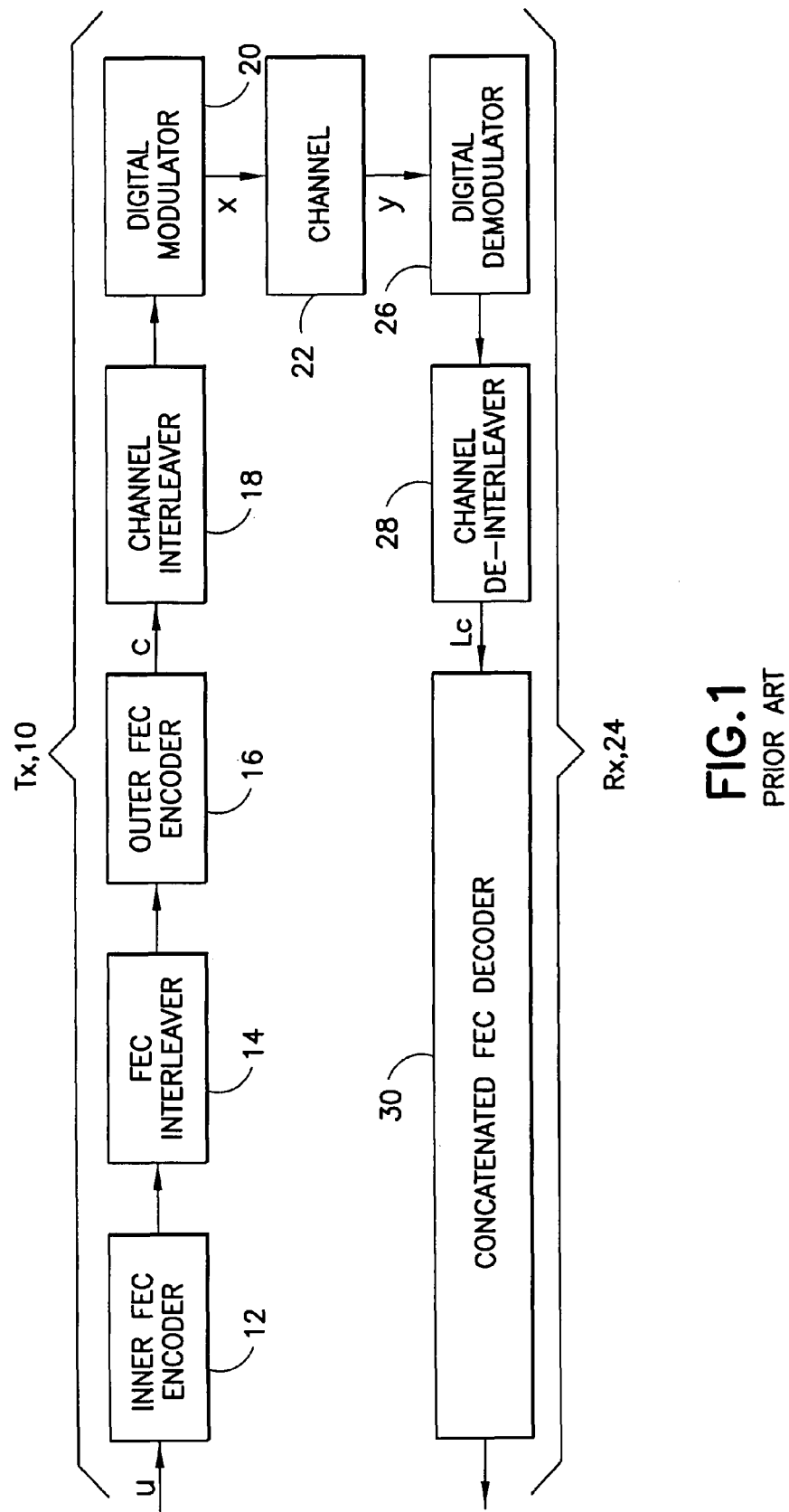
FIG. 1 is a simplified block diagram of a digital communications system using serial concatenated FEC.
Figure 2:
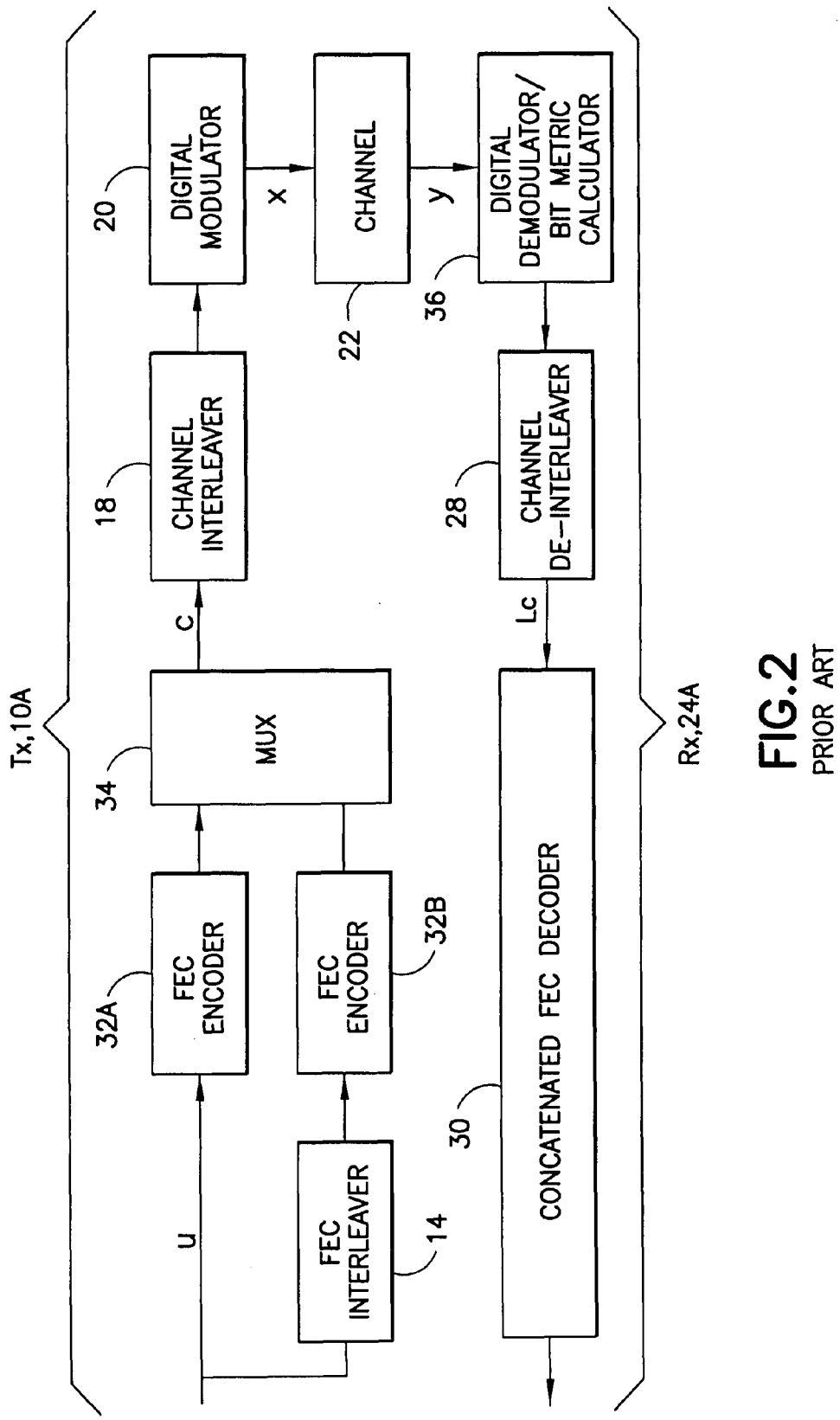
FIG. 2 is a simplified block diagram of a digital communications system using parallel concatenated FEC.

The following abbreviations appear in the description of the invention:

3GPP Third Generation Partnership Project
ADC Analog to Digital Converter
AGC Automatic Gain Control AWGN Additive White Gaussian Noise
BCH Bose-Chaudhuri-Hochquenghem
BEP Bit Error Performance
BPSK Binary Phase Shift Keying
CC Convolutional Code
DAC Digital to Analog Converter
FEC Forward Error Correction
QPSK Quadrature Phase Shift Keying
RFFE Radio Frequency Front End
RS Reed-Solomon
TC Turbo Code By way of introduction, and referring to FIGS. 1 and 2, there are shown simplified conventional digital transmission schemes using serial and parallel-concatenated FEC techniques, respectively, in conjunction with interleaving. In FIG. 1, a serial concatenation embodiment is shown that incorporates FEC interleaving. Examples of serially concatenated FEC techniques include RS-CC and serially concatenated convolutional codes (or serial Turbo Codes).

In FIG. 1 a communications system includes a transmitter (Tx) 10 for transmitting a signal (u), the transmitter 10 having an inner FEC encoder 12, a FEC interleaver 14, an outer FEC encoder 16 outputting an encoder signal (c), a channel interleaver 18 and a digital modulator 20. The output of the digital modulator 20 (signal (x)) is transmitted through a channel 22 and is received as signal (y) at a receiver (Rx) 24 having a corresponding digital demodulator 26, a channel de-interleaver 28 that outputs a signal (Lc) and a concatenated FEC decoder 30. Further downstream circuitry is not shown, as it is not germane to an understanding of this invention.

In the parallel embodiment of FIG. 2 the transmitter 10A includes the FEC interleaver 14 that receives the signal (u), and a pair of paralleled FEC encoders 32A and 32B, with the FEC encoder 32A directly receiving the signal (u) and the FEC encoder 32B receiving the signal (u) via the output of the FEC interleaver 14. The outputs of the FEC encoders 32A, 32B are applied to a 2:1 multiplexer (MUX) 34 that outputs the encoded signal (c) to the channel interleaver 18 and digital modulator 20. Signal (x) is transmitted through the channel 22 and is received as the signal (y) at a receiver 24A. The receiver 24A includes a digital demodulator/bit metric calculator 36, the channel de-interleaver 28 and the concatenated FEC decoder 30.

In FIGS. 1 and 2, the code bits (c) from the FEC encoder(s) 16 or 32A, 32B are interleaved by the channel interleaver 18 prior to digital modulation. After transmission over the channel 22, the coded bit metrics are de-interleaved and the metrics (Lc) are passed to the FEC decoder 30. For turbo codes and convolutional codes with Viterbi decoding, the coded bit metrics are assumed to be soft values.

In the ensuing description of this invention a consideration is made of a "severe block fading" or "burst jamming" channel 22. For a general digital communication system, symbols $x_k$ are generated and transmitted over a linear channel. In accordance with a suitable channel model, the output of a matched filter, $y_k$, can be written as:

$$y_k = a_k x_k + n_k + j_k,$$

Where $a_k$ is the channel attenuation, $n_k$ is AWGN due to typical RF receiver noise, and $j_k$ is AWGN due to an external jamming source. Es may be defined as the average energy per symbol, $N_0$ as the noise spectral density of the receiver AWGN, and $J_0$ as the noise spectral density of the jamming source.

For burst jamming, one may ignore the signal attenuation ($a_k=1$) and consider only the external jamming source. In this case, during periods of jamming the signal-to-noise ratio (SNR) of the transmission is given by:

$$SNR = \frac{Es}{N_0 + J_0}.$$

The jamming may be modeled as an intermittent, possibly periodic, source of interference. In general, the model assumes that the jamming is either present or is not present. When the jamming is present, it tends to persist over several, possibly hundreds of symbols. Thus, one has:

$$j_k = \begin{cases} N(0, J_0) & k \in \Omega \\ 0 & \text{else} \end{cases},$$

where $\Omega$ is the set of symbol indices k where jamming is present.

Figure 3:
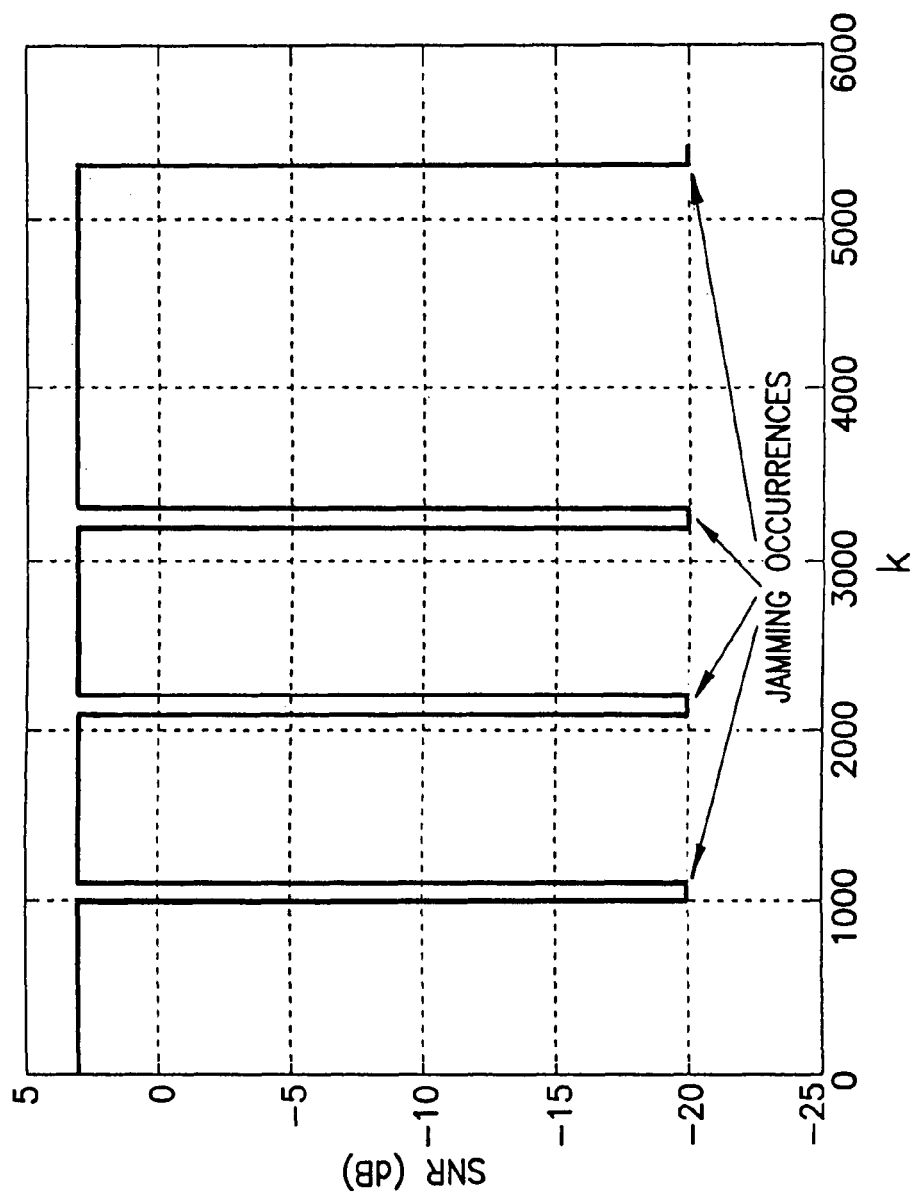
FIG. 3 is an example of intermittent jamming depicted in graphical form by plotting SNR versus symbol number (k)

FIG. 3 is a graph that plots SNR as a function of time (k) for the periodic jamming case. As can be seen, during periods of no jamming the SNR is equal to Es/No, or 3 dB in this example. When jamming is present, the jamming source is assumed to be large relative to the signal energy and receiver noise ($J_0 \gg Es$ and $J_0 \gg N_0$), resulting in the SNR being dominated by the jamming. In the plot of FIG. 3, it was assumed that the jamming was 20 dB greater than the signal energy (although it could more or less than this particular exemplary value).

For block fading, one may ignore the jamming ($J_0=0$) and focus instead on the signal attenuation ($a_k$). In this case, the per-symbol SNR is given by:

$$SNR_k = \frac{a_k Es}{N_0}$$

For atmospheric fading effects, the attenuation is typically modeled as a Rayleigh or Ricean random variable. It is preferred herein to model the fading process as a step function, giving, $$a_k = \begin{cases} 0 & k \in \Omega \\ 1 & \text{else} \end{cases}$$

where $\Omega$ is the set of symbol indices k where the signal is severely attenuated. This model arises from transmissions that experience intermittent, possibly periodic, shadowing or obstruction. These obstructions (or shadows) can severely attenuate the received signal. Furthermore, it is assumed that when this severe attenuation occurs, it typically occurs over several symbols, or possibly over some hundreds of symbols. Thus, one may term the channel a severe block-fading channel.

Figure 4:
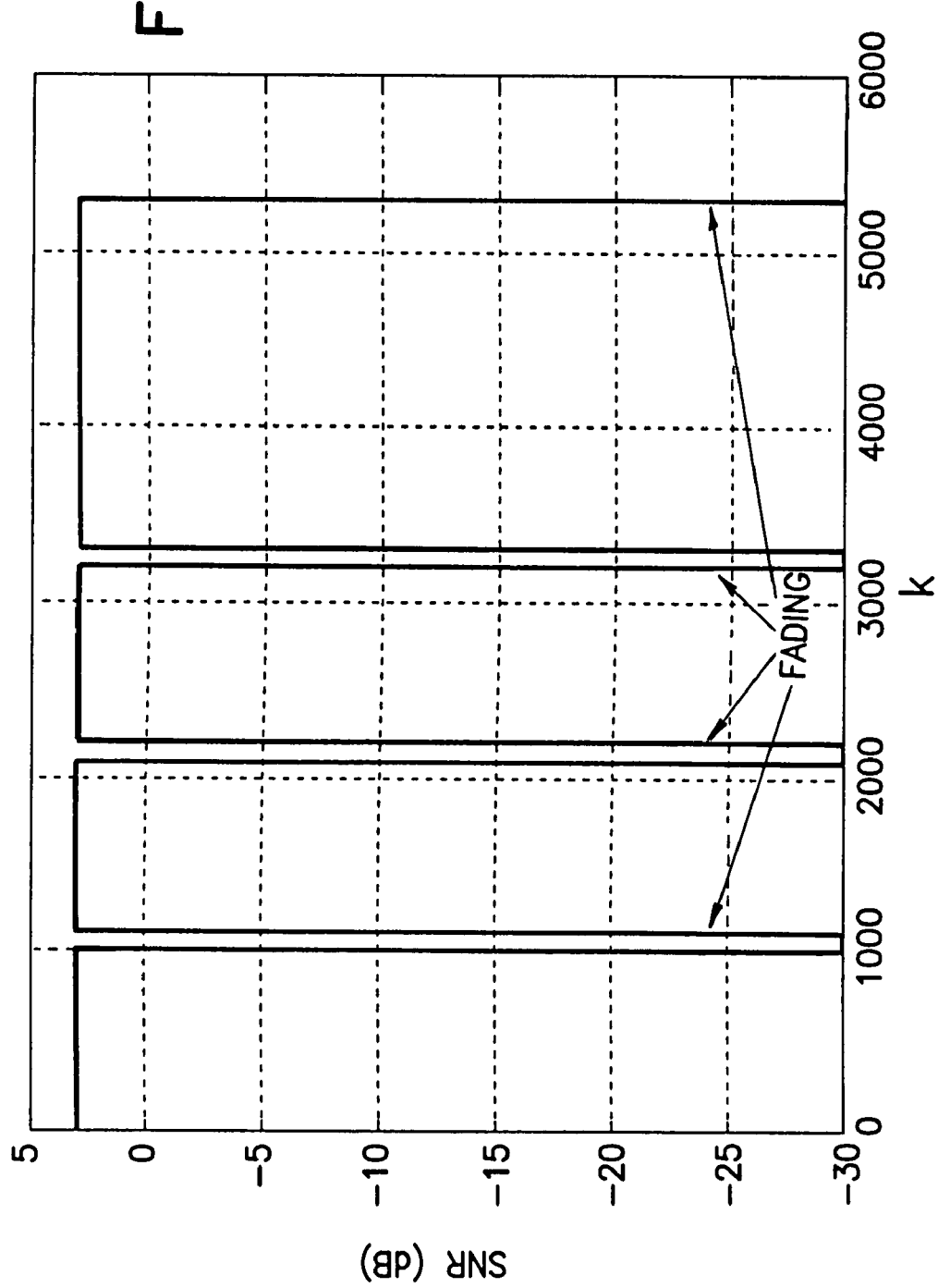
FIG. 4 is an example of extreme block fading also depicted in graphical form by plotting signal-to-noise (SNR) versus symbol number.

FIG. 4 illustrates a plot of the SNR as a function of (k) for the case of intermittent severe block fading. As can be seen, in periods of no fading the SNR is equal to Es/No or 3 dB. When the signal is severely attenuated, a SNR of negative infinity (e.g., noise only) is observed at the receiver. In the plot shown in FIG. 4, the set of indices where the signal is severely attenuated is given by:

$$\Omega = \{1000, 1001, \ldots, 1099, 2100, 2101, \ldots, 2199, 3200, 3201, \ldots, 3299, 5300, 5301, \ldots, 5399\}.$$

A discussion is now made of modified decoding in the presence of intermittent jamming and/or severe block fading in accordance with this invention. The intermittent jamming and/or severe block fading events may be collectively referred to herein as a "symbol degrading event". For the purposes of this invention a symbol degrading event of interest may contain at least about eight to 10 symbols, or more (the variance of the SNR estimate is function of the number of symbols).

When transmitting over intermittent jamming or block fading channels, knowledge of the channel can improve FEC decoding performance. For fading environments, optimum performance is achieved when the fading coefficients ($a_k$) are known exactly by the decoder 30. This can be accomplished using data-aided techniques (e.g., using pilot or training symbols that are inserted into the transmission) or via one of several blind approaches, such as was described by Eric Hall and Stephen G. Wilson, "Design and Analysis of Turbo Codes on Rayleigh Fading Channels," IEEE Journal on Selected Areas in Communications, Vol. 16, No. 2, February 1998.

For a channel of interest to this invention, the received signal has a nominal SNR for periods of time with occasional (possibly periodic) severally degraded signals due to jamming or signal attenuation. For the purposes of this invention, one can consider the case of BPSK modulation and then examine the optimum bit metrics for use over jammed or faded channels.

First, the optimum bit metric for BPSK over an AWGN channel with fading is given by:

$$Lc_k = \log\left[\frac{P(y_k \mid c_k = 1, a_k)}{P(y_k \mid c_k = 0, a_k)}\right]$$

$$= y_k \cdot \left(\frac{4 a_k \sqrt{Es}}{\sigma_k^2}\right)$$

where $a_k$ is the fading coefficient which is assumed known and $\sigma_k^2$ is the noise variance for the $k^{th}$ received symbol.

For the case of coded bit metrics with extreme jamming, and considering an intermittent jamming channel, one may take $a_k=1$, in which case it can be shown that the noise variance is given by:

$$\sigma_k^2 = \begin{cases} \frac{N_0}{2} + \frac{J_0}{2} & k \in \Omega \\ \frac{N_0}{2} & \text{else} \end{cases}$$

When the jamming becomes large relative to the signal energy (Es), the scaling term becomes small. As a result, one may approximate the optimum metric as:

$$Lc_k = \begin{cases} 0 & k \in \Omega \\ y_k \cdot \left(\frac{2\sqrt{Es}}{N_0}\right) & \text{else} \end{cases}$$

From this equation it can be seen that during periods of extreme jamming the optimum metric is essentially an "erasure", or zero value. Stated another way, during periods of extreme jamming, the optimum input to the FEC decoder 30 contains "no information." Furthermore, for algorithms such as the Viterbi algorithm and the MAX-Log-MAP (or Log-MAP) algorithm used in turbo decoding, the scaling of the received signal $y_k$ is unnecessary. For Turbo Decoding using the Log-MAP algorithm scaling is necessary, as the optimum theoretical decoding algorithm requires knowledge of $a_k\sigma^2$.

Considering now the case of coded bit metrics with extreme signal attenuation, for fading one may ignore the jamming source ($J_0=0$). This implies that the optimum bit metric is given by:

$$Lc_k = y_k \cdot \frac{2 a_k \sqrt{Es}}{N_0}.$$

When using the block-fading model, where $a_k$ takes values of 0 or 1, the bit metric simplifies to:

$$Lc_k = \begin{cases} 0 & k \in \Omega \\ y_k \cdot \left(\frac{2\sqrt{Es}}{N_0}\right) & \text{else} \end{cases}.$$

From this equation it can be seen that during periods of severe signal attenuation the optimum metric is essentially an "erasure" or 0-value. Stated another way, during periods of extreme jamming, the optimum input to the FEC decoder contains "no information." Furthermore, and as was the case for jamming, for algorithms such as the Viterbi algorithm and the Log-MAP algorithm, the scaling of the received signal $y_k$ is unnecessary, while for turbo decoding using the Log-MAP algorithm, the scaling is necessary.

Figure 5:
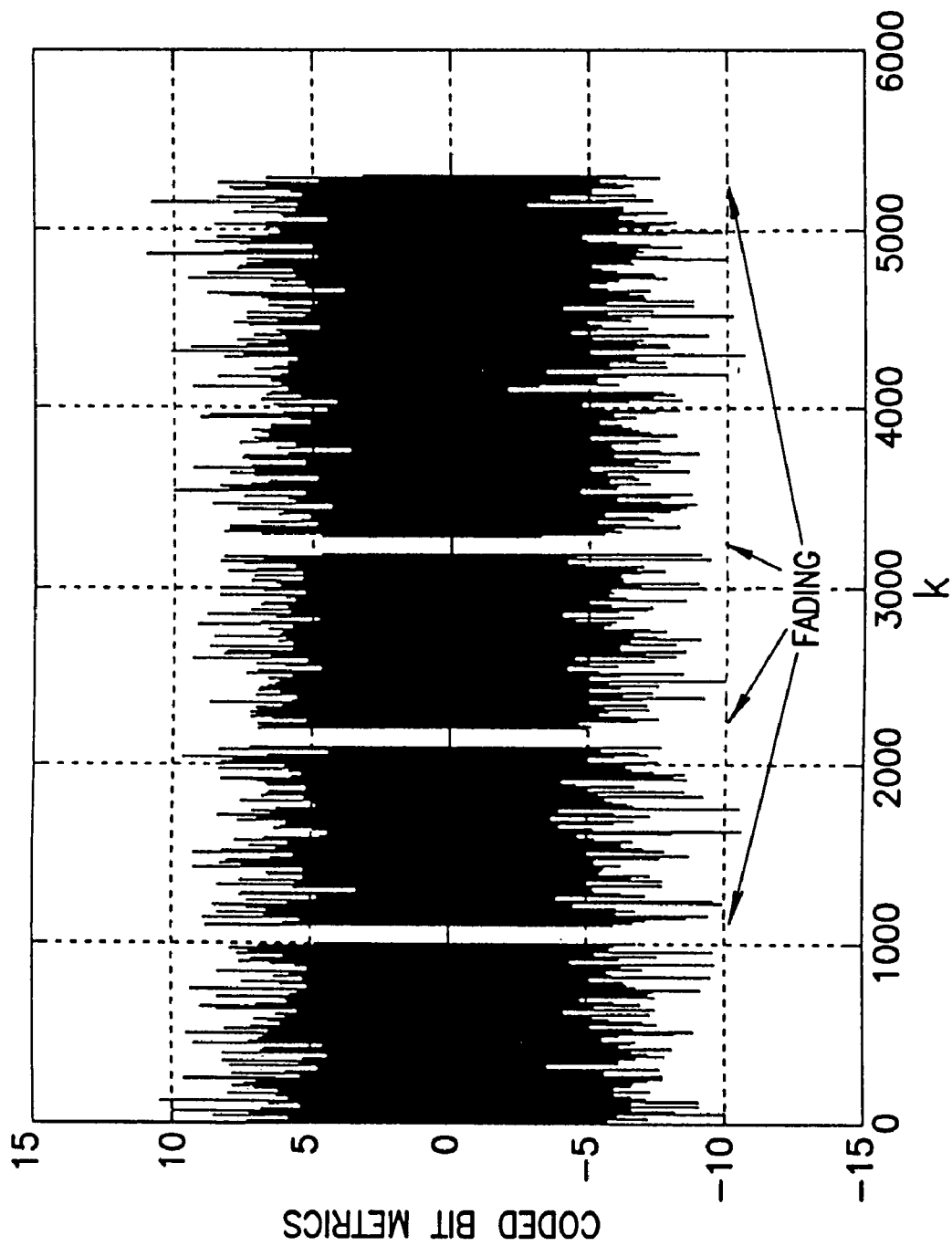
FIG. 5 illustrates coded bit metrics (Lc) plotted versus symbol number for a known block signal attenuation prior to channel interleaving.

FIG. 5 illustrates an example of the bit metrics corresponding to FIG. 4.

Figure 6:
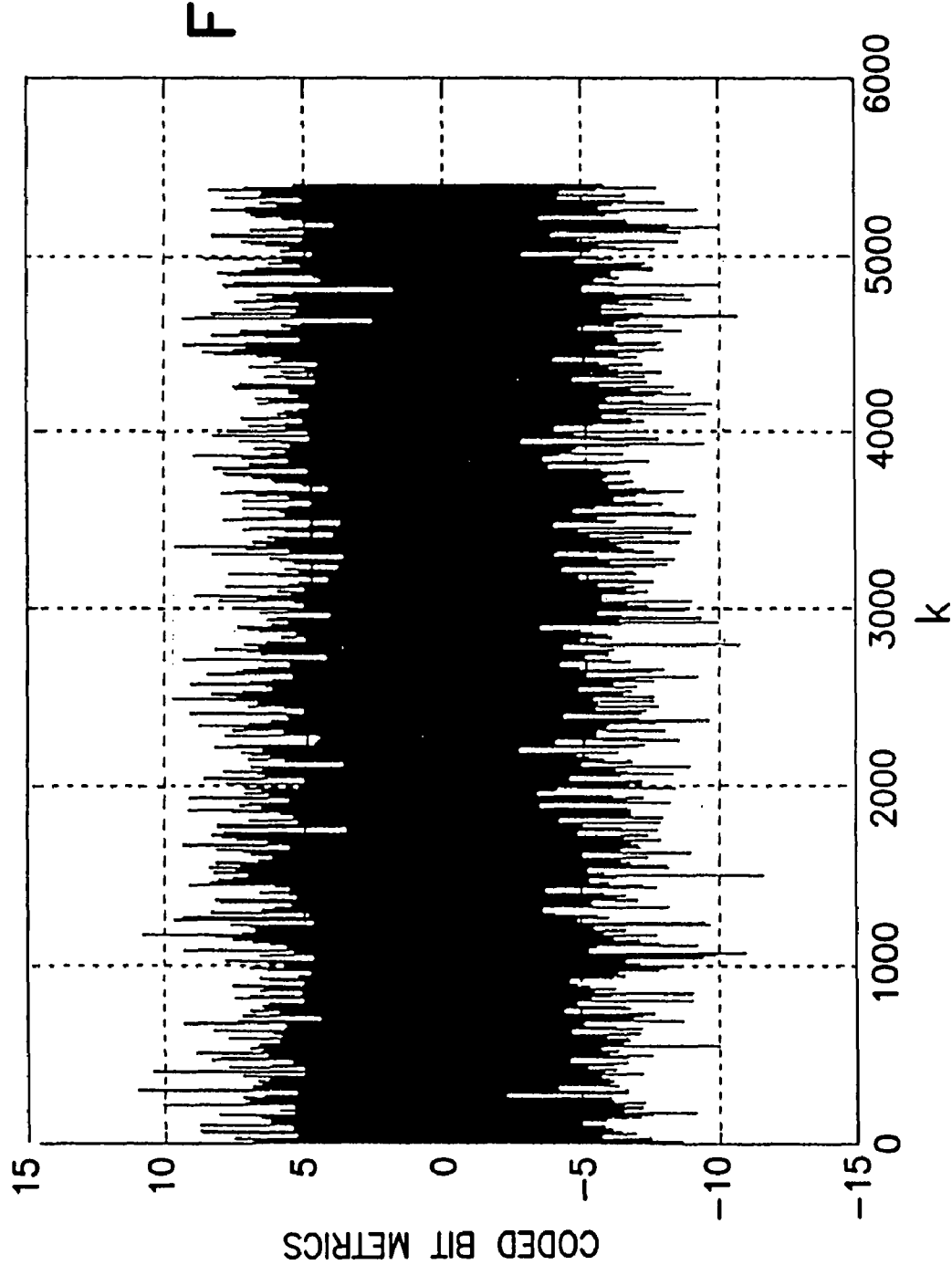
FIG. 6 illustrates coded bit metrics (Lc) plotted versus symbol number for a known block signal attenuation subsequent to channel interleaving.

With regard now to the effects of interleaving, in FIG. 5 it can be seen that using optimum (or near-optimum) bit metrics on block fading or jammed channels can result in the presence of large, contiguous blocks of severely degraded symbols. Traditional FEC techniques will fail under these conditions unless channel interleaving is used to "break-up" these large runs of errors. FIG. 6 shows the effects of a symbol interleaver that, by temporally dispersing the degraded symbols, aids in improving the over-all error rate.

More specifically, after channel interleaving the runs of severely corrupted symbols are randomized and are more amenable to being correctible by the FEC decoder 30. In a preferred embodiment of this invention the interleaver depth, assuming a periodic jamming source or deep fading event, is less than the period between two adjacent events.

Figure 7:
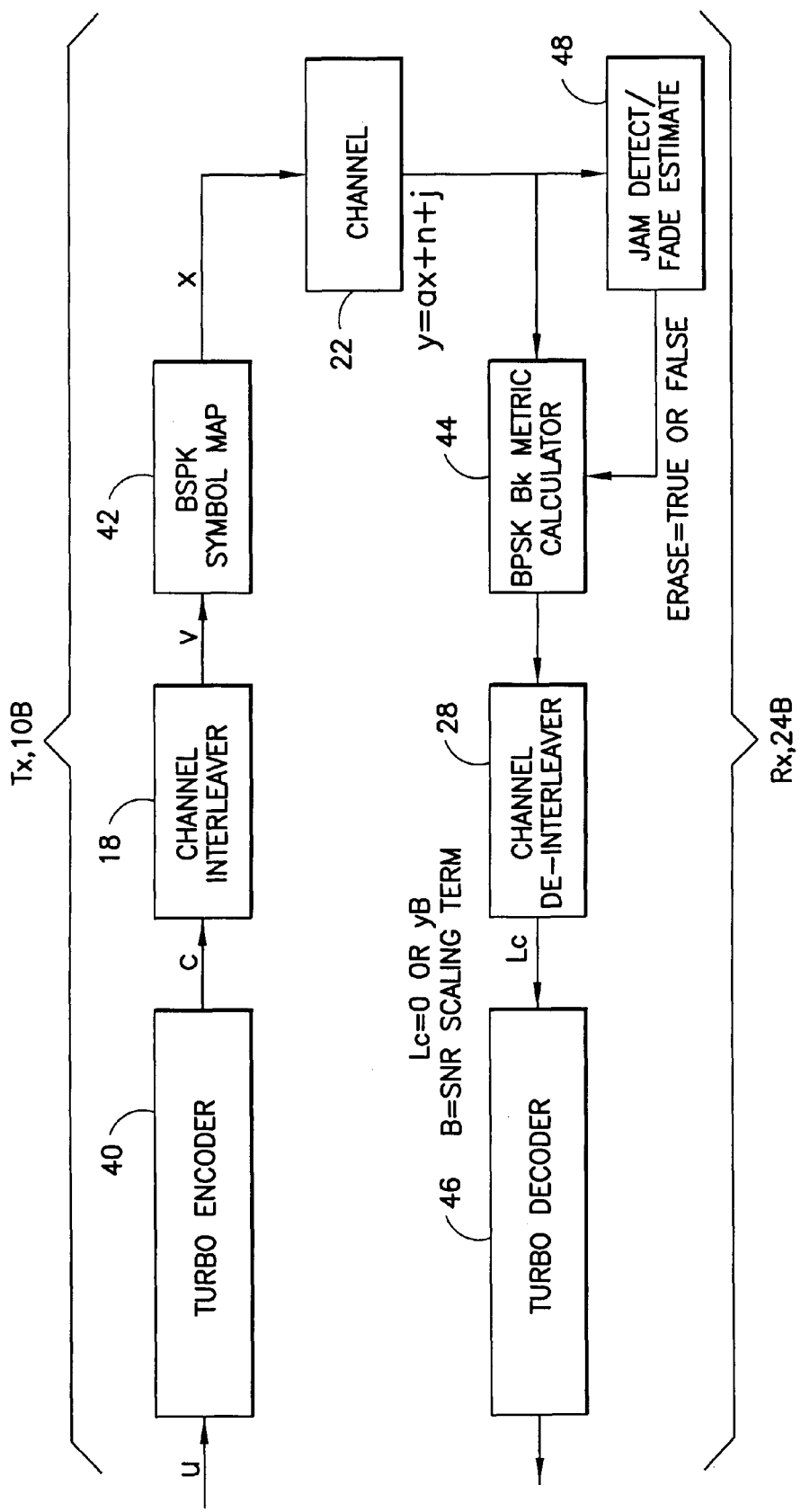
FIG. 7 is a simplified block diagram of a BPSK communication system in accordance with an embodiment of this invention.

With regard now to Turbo Decoding with block fading or jamming, in a turbo-coded system the decoder uses soft-input data in an iterative decoding scheme. FIG. 7 illustrates modifications to the transmitter 10B and receiver 24B for operation over a block faded or jammed channel 22. In this embodiment the Tx 10B includes a concatenated FEC or a turbo encoder 40 followed by the channel interleaver 18 that in turn is followed by a BPSK symbol mapper (modulator) 42. AT the RX 24B the signal received from the channel 22 is applied to a BPSK bit metric calculator (demodulator) 44. The calculator 44 is followed by the channel de-interleaver and then by a turbo decoder 46.

In accordance with an aspect of this invention, the Rx 24B also includes a jam detect/fade estimate circuit 48 that has an input coupled to the channel 22 and an output for indicating an erasure condition (true/false) to the QPSK/BPSK bit metric calculator 44. The circuit 48 operates to estimate or detect the presence of jamming or fading and, when detected, "erasures" or zero symbols are inserted into the input of the turbo decoder 46 in place of the degraded symbols, thereby mitigating the effect that the degraded symbols would have on the operation of the turbo decoder 46. Examples of several embodiments of the jam detect/fade estimate circuit 48 are shown in FIGS. 13-16 and are described below.

Having thus described a technique for improving FEC performance of block fading/jamming channels, an examination is now made, using simulations, of the performance of a short block-length turbo code design. The simulations assume a 3GPP Turbo Code design using a block length of 256 bits (see, for example, ETSI TS 125 212 V3.4.0 (2000-09), Universal Mobile Telecommunications System (UMTS); Multiplexing and channel coding (FDD) (3GPP TS 25.212 version 3.4.0, Release 1999)), and QPSK modulation was used. It can be recalled that QPSK modulation can be viewed as two-channel BPSK modulation, leaving the optimum coded bit metrics largely unchanged from those given for BPSK.

Figure 8:
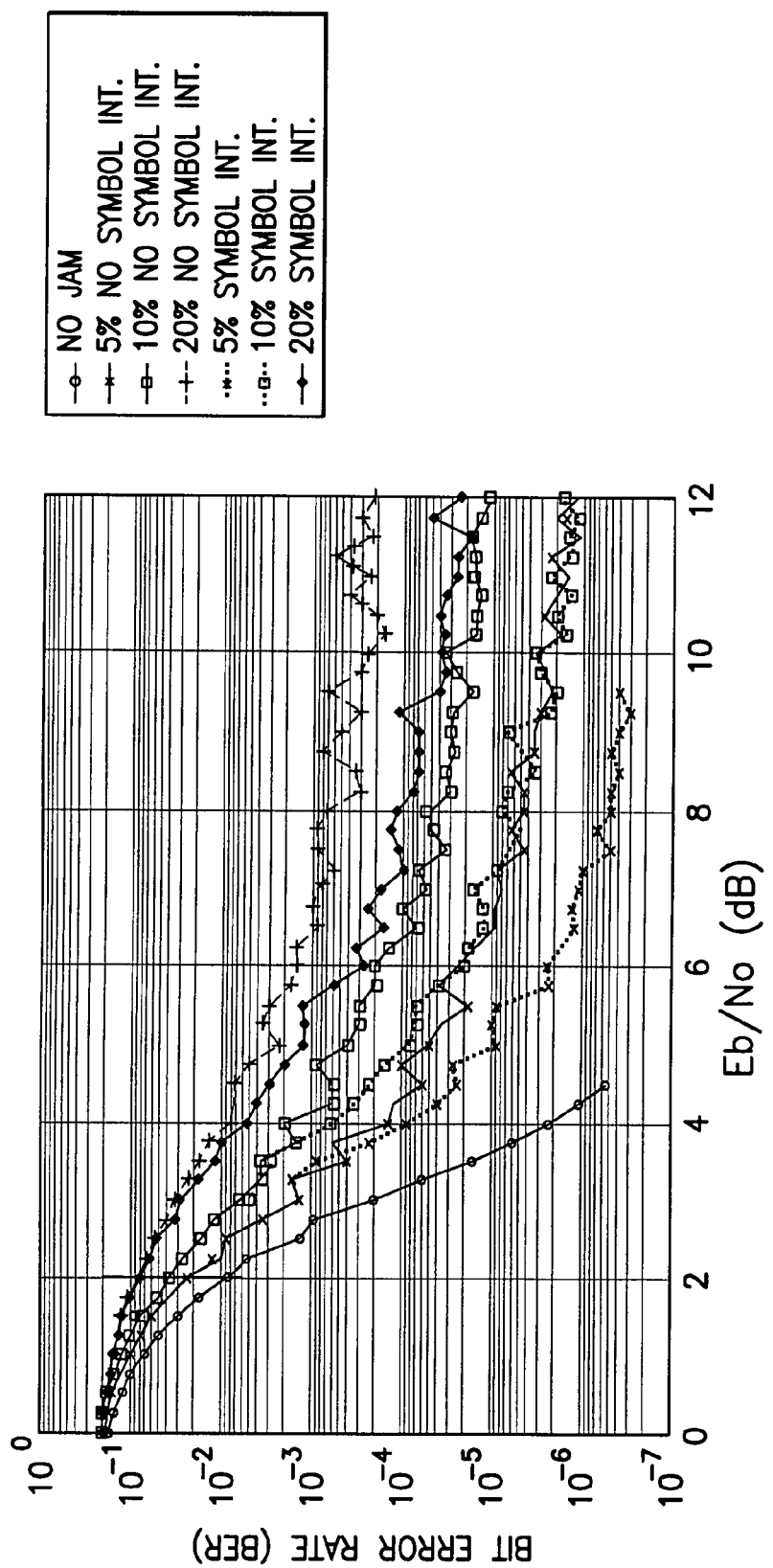
FIG. 8 plots Bit Error Performance (BEP) of a (268,128) 3GPP Turbo Code with and without symbol interleaving (Symbol Int.) on an AWGN channel with jamming.

For the simulation, the turbo decoder 46 used the Max-Log-MAP algorithm with eight decoding iterations. The Max-Log-MAP algorithm negates the need for scaling of the received symbols by the SNR. For all data points, at least 100 bit errors were observed. Results are shown for the bit error rate (BER) assuming different jamming circumstances. FIG. 8 shows the effect on the BER for what is considered to be a light jamming event (5% jammed symbols per block), a moderate jamming event (10% jammed symbols per block) and a heavy-jamming event (20% jammed symbols per block). For each case, an examination is made in FIGS. 9-11 of the performance and the impact of certain jamming countermeasures, such as symbol interleaving and turbo decoder 46 information (e.g., erasure).

As a baseline, FIG. 8 shows the performance of the turbo decoder 46 with and without symbol interleaving. As can be seen, performance is severally degraded when communicating over these channels. The effect of these severe channel conditions is noted by the presence of an irreducible error floor in the error curves. Furthermore, turbo decoding benefits from randomization of the several error symbols.

Figure 9:
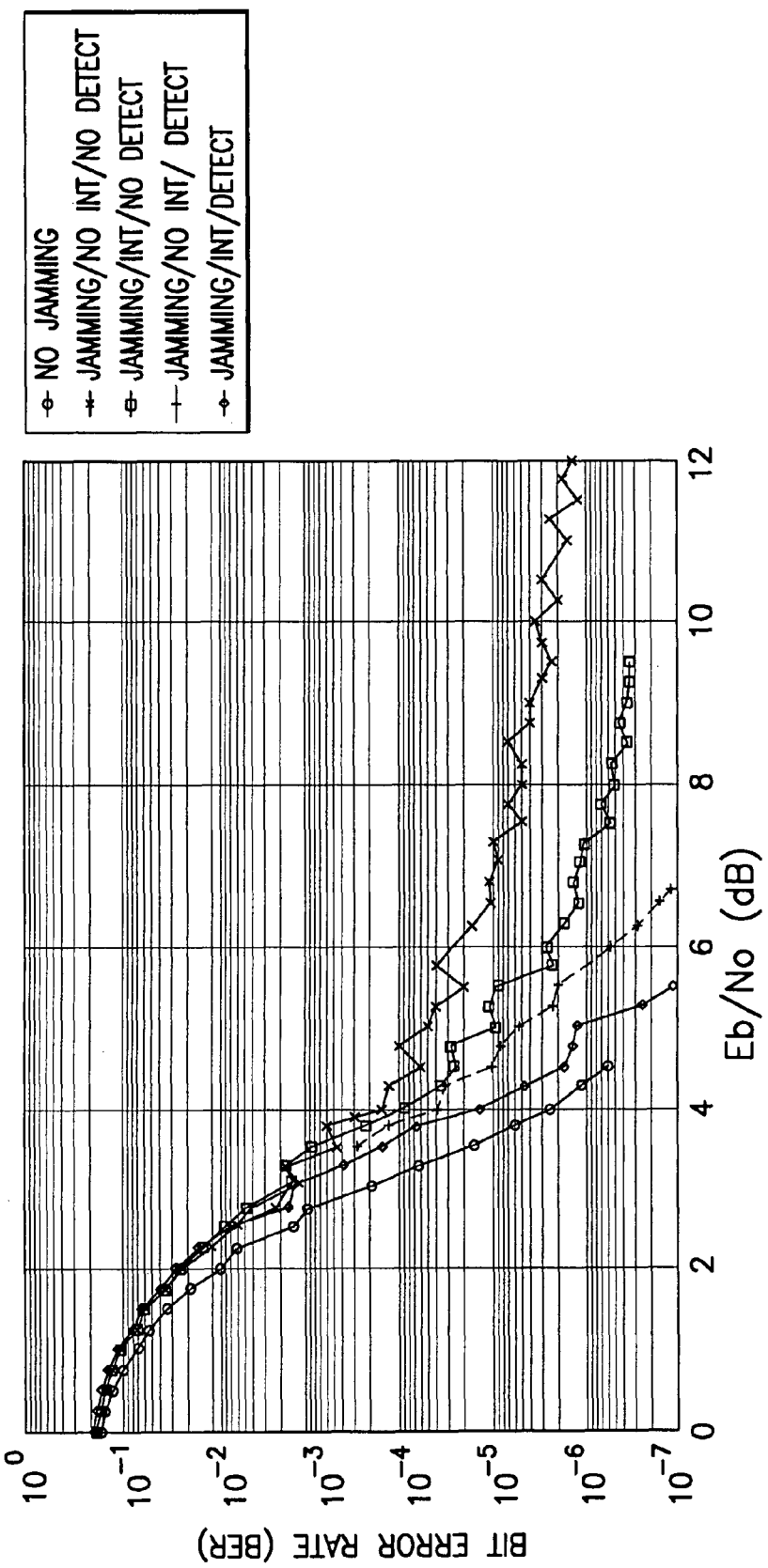
FIGS. 9, 10 and 11, related to FIG. 8, illustrate the BEP with 5% jamming, 10% jamming and 20% jamming, respectively.
Figure 10:
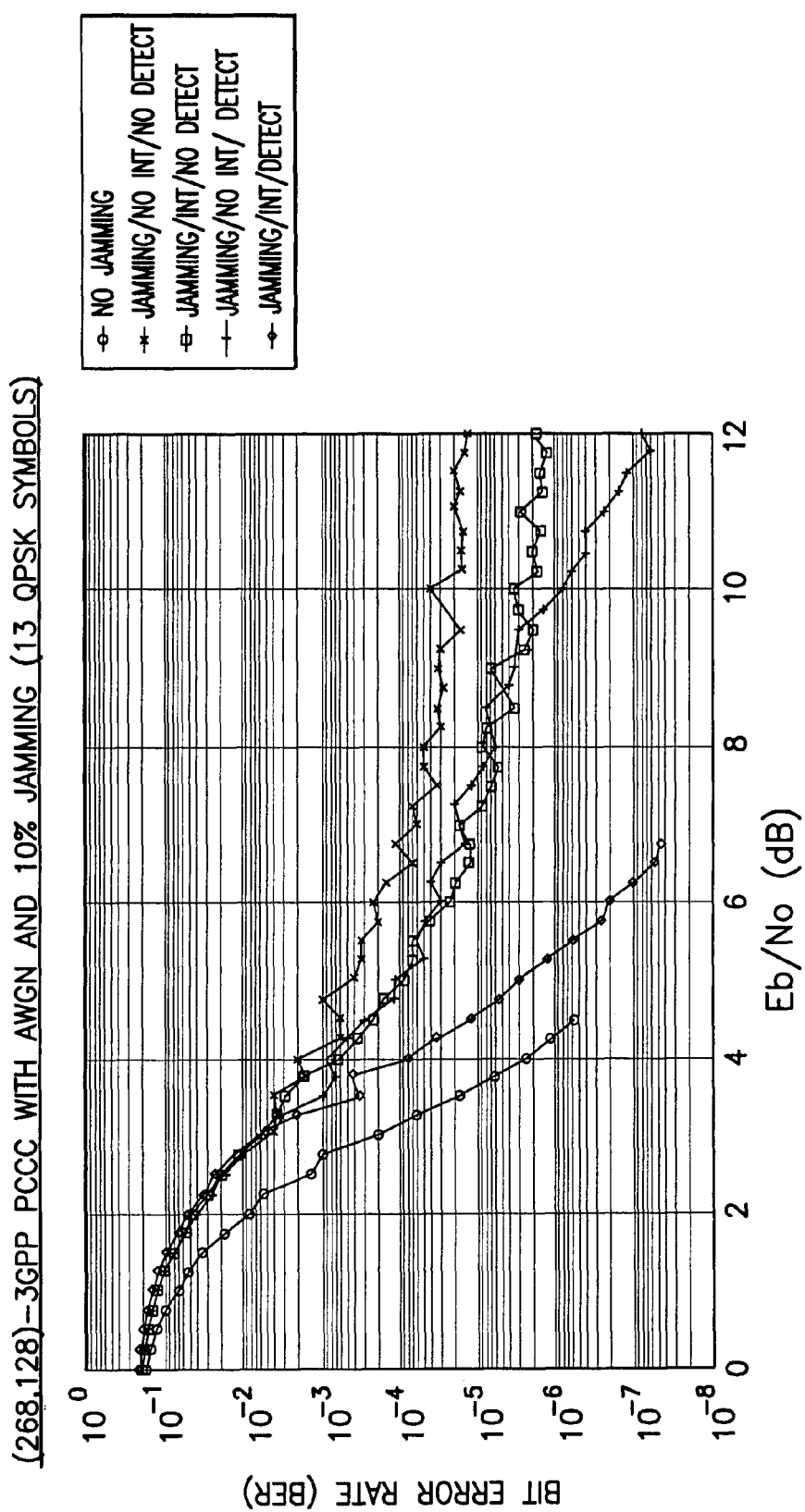
Figure 11:
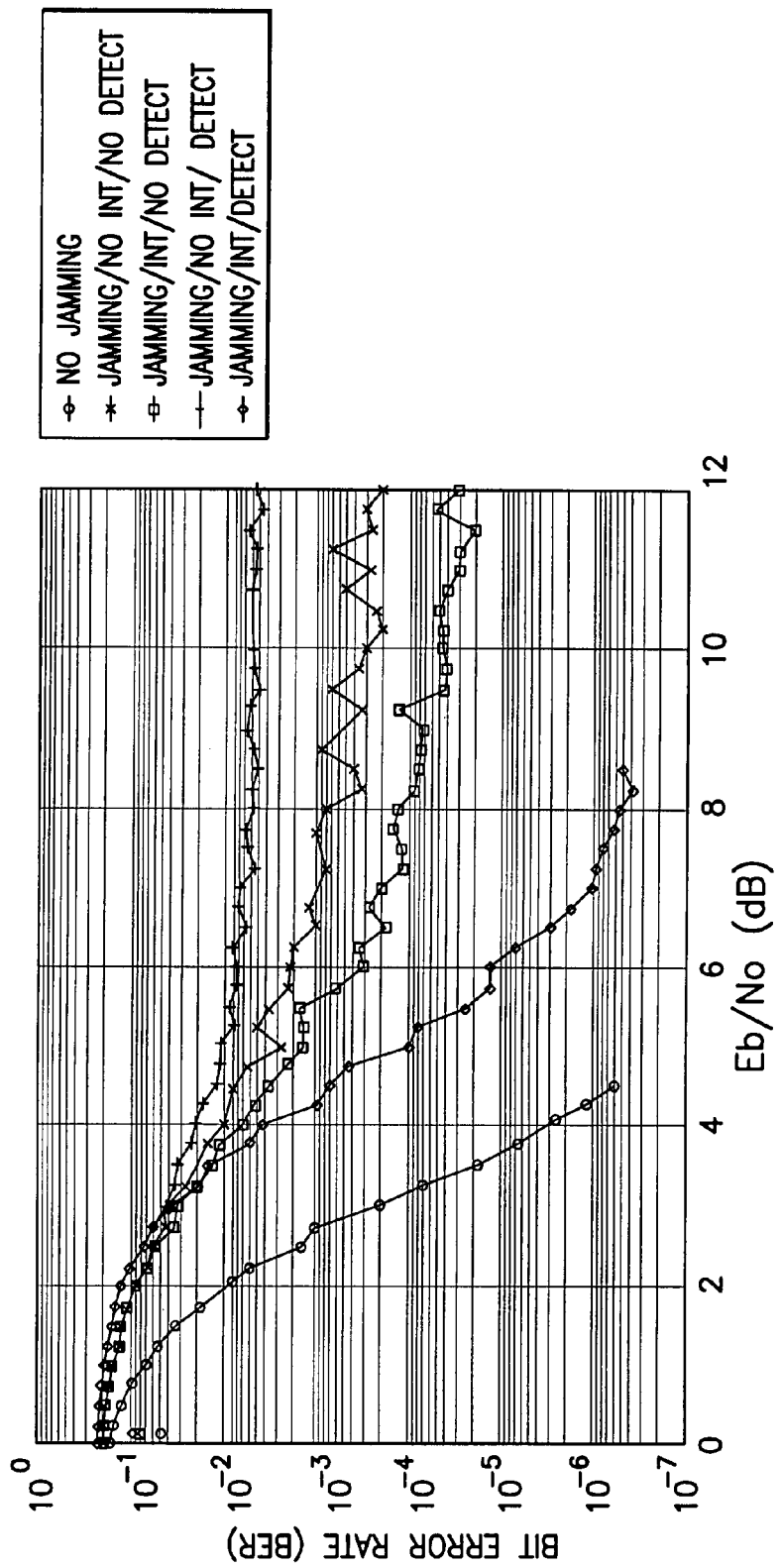

In FIGS. 9-11 the effects of both channel interleaving and jammer detection (e.g., erasures) are investigated. As can be seen, the optimum scheme uses both channel interleaving, for randomization of errors, and erasures (i.e., it uses the channel interleaver 18/channel de-interleaver 28 and the jam detect/fade estimate block 48). Even for the case where 20% of the symbol block is jammed, performance degrades only 2.5 dB at a bit error rate of $10^{-6}$, when using the optimum solution in accordance with this invention.

A discussion is now made of CC/RS decoding with block fading or jamming. Many concentrated coding schemes use an inner convolutional code followed by an outer block code. Typically, the outer block code is a Reed-Solomon or BCH code and interleaving is often used between the encoding stages (see, for example, blocks 12, 14 and 16 in FIG. 1). For decoding, the soft-channel data is decoded using the Viterbi algorithm, which outputs hard decisions to the RS or BCH decoder. For a block code with minimum distance $d_{min}$, the decoder can guarantee correction of $$\left\lfloor \frac{d_{min}-1}{2} \right\rfloor$$

errors or $\lfloor d_{min}-1 \rfloor$ erasures. For typical decoder designs, erasures are not used. However, in accordance with this invention the erasure decoding of RS or BCH codes is employed to advantage.

In channels with block jamming or fading, the estimation of the fading process gives information as to when the output of the Viterbi decoder will be in error. By anticipating these errors, erasures can be declared, thus improving the performance of the overall concatenated decoder.

Figure 12:
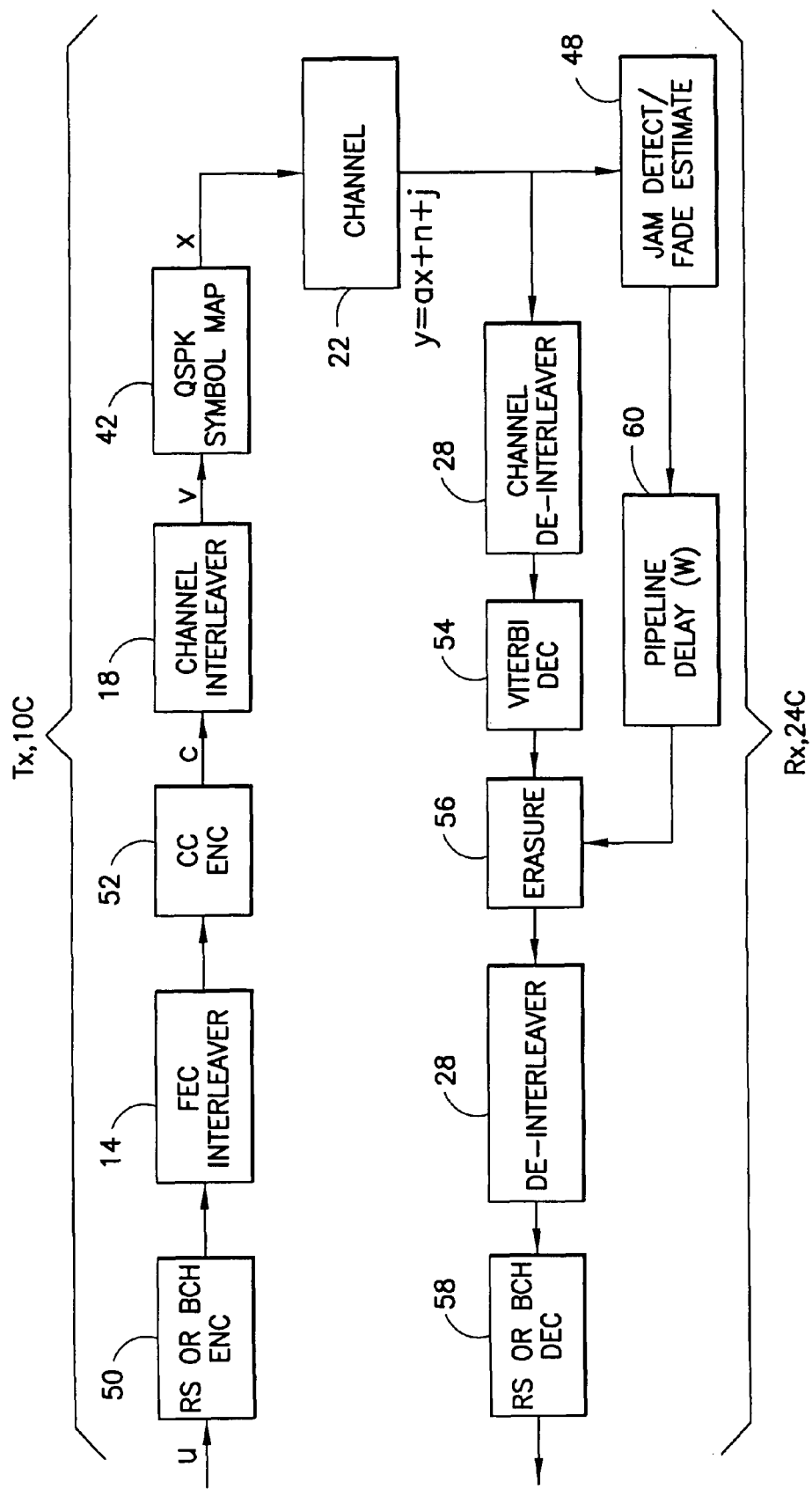
FIG. 12 is a simplified block diagram of a communication system in accordance with this invention that employs a concatenated Reed-Solomon/Convolutional Code (RS/CC) with jammer detection.

FIG. 12 illustrates an embodiment of this approach, where the channel interleaver 18 may be optional, provided the FEC interleaver 14 is sufficiently long.

More specifically, FIG. 12 shows a Concatenated RS/CC technique with jammer detection. The transmitter 10C includes a RS or BCH (FEC) encoder 50, the FEC interleaver 14, a CC encoder 52, the (optional) channel interleaver 18, and the QPSK symbol mapper 42. The signal y=ax+n+j received from the channel 22 is applied to the channel de-interleaver 28 (assuming the presence of the channel interleaver 18), then to the soft input Viterbi decoder 54. At the output of the Viterbi decoder 54 is an erasure block 56, followed by a FEC de-interleaver 28 and an appropriate RS or BCH decoder 58. The jam detect/fade estimate block 48 also receives the signal from the channel, and outputs the erasure signal to the erasure block 56, if needed, via a pipeline delay element 60 that is used to account for the signal processing delays in the channel de-interleaver 28 and in the Viterbi decoder 54. In this embodiment the erasure block 56 erases jammed or faded symbols post-Viterbi decoding, and pre-FEC de-interleaving, as the RS or BCH decoder 58 generally handles the presence of erased symbols very well.

A discussion is now made of methods for detecting periods of jamming or severe signal attenuation, and thus presents embodiments of the jam detect/fade estimate block 48.

As has been shown, FEC performance can be significantly improved for a burst jamming and/or extreme block fading channel when the jamming/fading events are reliably detected. In the simulation results reflected in FIGS. 8-11, a priori knowledge of these events was assumed. In real world systems, however, it is preferred that some technique be employed to estimate the occurrence of these events. In general, there are two classes of such methods: data-aided and blind. With data-aided approaches, known data embedded in the received data is used to facilitate estimation of severe events. For blind approaches, the receiver 24 does not use any a priori information, but relies instead only on the received data.

Due to the burst nature of the events that are of interest to this invention, it is preferred to consider a general class of windowed estimators. Here, the estimation/detection block 48 accepts a block of L received symbols. Based on computed statistics or known information regarding the L received symbols, a jam/fading detection is declared and erasures performed on the sequence of L symbols. A straightforward approach estimates the SNR within the block of L symbols, and if the SNR falls below a given threshold, an erasure is declared. It can be appreciated that for both jamming and severe signal attenuation, the occurrence of the event is characterized by an SNR much less than 0 dB.

Figure 13:
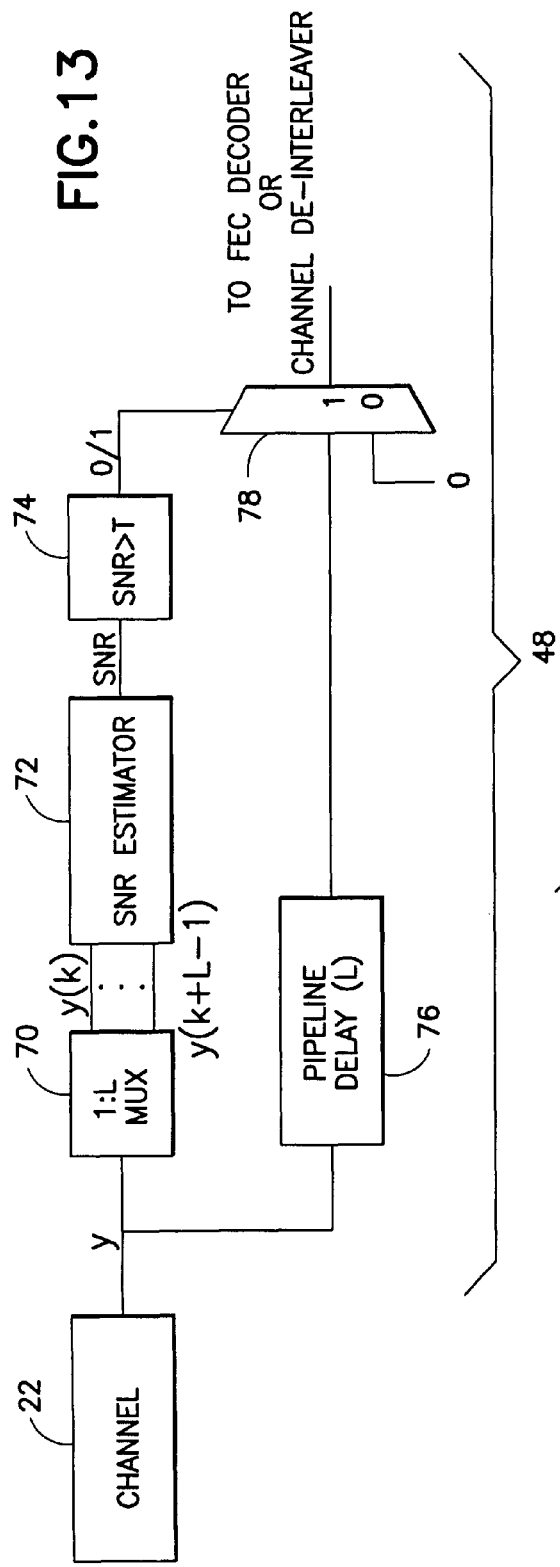
FIG. 13 is a block diagram of circuitry for providing a block SNR estimator and erasure insert circuit that is suitable for use with turbo decoding.

FIG. 13 shows an embodiment of a block SNR estimator and erasure insert circuit 48 that is suitable for use with turbo decoding. The signal y received from the channel 22 is applied to the input of a 1:L multiplexer (MUX) 70, which outputs y(k) to y(k+L−1) symbols in parallel to a SNR estimator 72. The output of the SNR estimator is applied to a comparator 74 that compares the estimated SNR of L symbols to the SNR threshold (T). T will typically have a value<0 dB, and may be fixed or programmable (variable). The binary output (0/1) of the comparator 74 is applied as a control input to an output symbol multiplexer 78 the outputs either the received symbol stream, via pipeline delay 76 (L symbols in duration), or a zero symbol, to the FEC decoder (e.g., 58) or channel de-interleaver 28, depending on how the receiver is architected.

For severe fading environments, the receiver AGC circuitry may be used for detecting severe signal attenuation. Typically, digital communications receivers employ AGC for purposes of guaranteeing certain signal levels through the demodulator. As the received signal levels fluctuate the AGC circuit adds or subtracts gain to maintain approximately constant signal levels throughout the receiver. When the received signal is severely attenuated, the AGC circuit becomes "captured" by the RF receiver noise. For the purposes of this invention, the AGC capture condition can be detected by observing the AGC command signal. Note, however, that for this technique to work properly, the AGC control loop should be fast enough to detect the severe attenuation of the signal. Alternatively, an auxiliary "signal strength circuit" may be added for this purpose.

Figure 16:
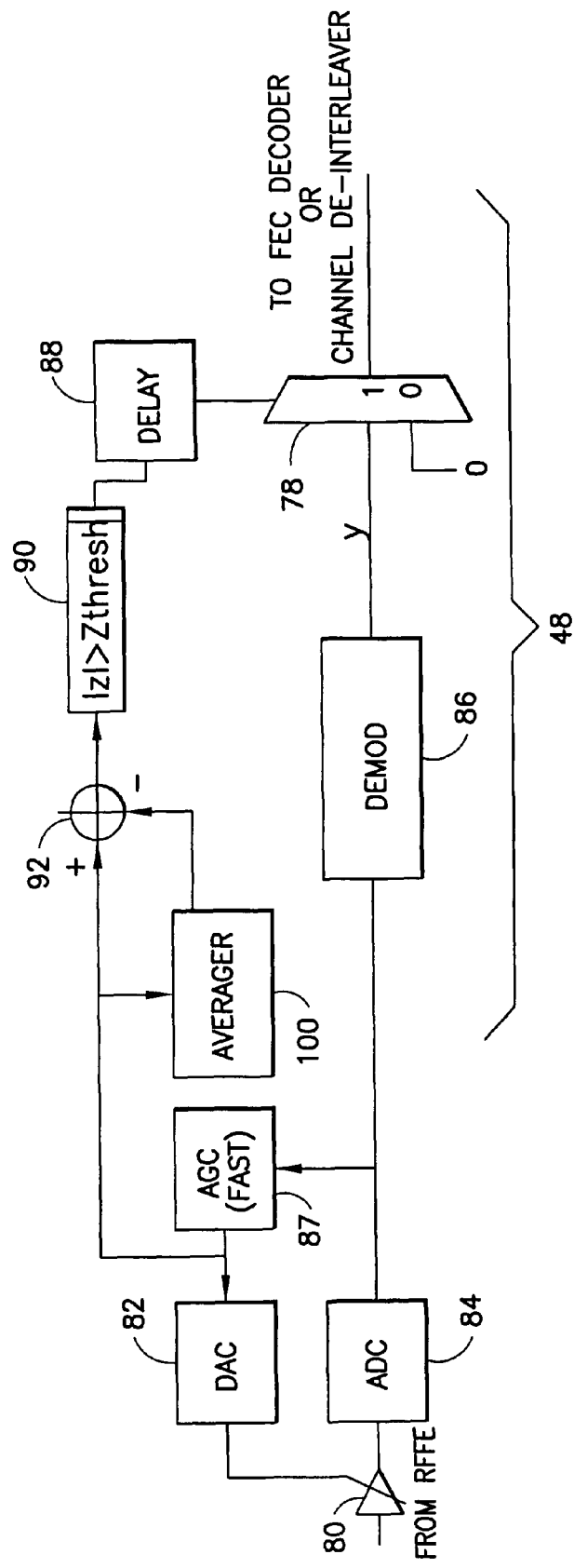
FIG. 16 is a block diagram of a third embodiment of circuitry for providing AGC-based detection of severe block fading.

In FIGS. 14-16 there are illustrated three fading estimate circuit 48 embodiments for detecting block fading. In the embodiments of FIGS. 14 and 15, two AGC circuits are used, the conventional slow AGC circuit 85 and a fast(er) AGC circuit 87. Circuitry that is common to all three of the embodiments is an RFFE 80, the gain of which is controlled by a DAC 82 that receives an input from the AGC 85 or 87. An ADC 84 outputs samples of the received signal to the AGC units 85, 87, and to a demodulator (Demod) 86 (note that the demodulator 86 does not form a part of the fade estimator 48). Also common to all three embodiments is the output received signal/zero multiplexer 78, a suitable delay 88, and in FIGS. 15 and 16 a summing junction 92. In FIGS. 14 and 15 the AGC that controls the gain prior to the ADC 84 is the slow loop AGC 85. The second AGC (fast) 87 is added, which allows for faster detection of a severe signal fade. As a severe signal attenuation event occurs, the fast AGC 87 detects the event as the slow AGC 85 begins to adjust the gain of the RFFE 80, via DAC 82. As the slow AGC 85 converges (provided that it does), information regarding the gain level is used to detect the severe signal attenuation. In the embodiment of FIG. 14 the output of each AGC 85 and 87 is compared to a threshold in blocks 94 and 96, respectively, and the comparator outputs are applied to an OR function 98. In this embodiment the two AGC thresholds differ from one another. If either AGC comparator 94 or 96 exceeds its threshold, the logic one output from the OR 98 is delayed and then used to switch the output multiplexer 78 from outputting the received signal stream to outputting zero (erased) symbols. In the embodiment of FIG. 15 the output of the fast AGC 87 is subtracted from the output of the slow AGC 85, and the absolute value of the difference (z) is compared to the threshold in comparator 90. The comparator result is then used to control the output multiplexer 78, via delay 88.

In the embodiment of FIG. 16 only the one fast AGC 87 is used. In this approach, the fast AGC 87 is designed to quickly adapt to the jammed or faded signal in order to insure that the RFFE 80 and ADC 84 are maintained in the linear mode of operation (unsaturated). An averaging circuit 100 observes the gain command to the DAC 82 and builds a long-term moving average of the typical gain value.

It should be noted that as employed herein, a "slow" AGC is one in which the AGC loop bandwidth is less than about 1% of the symbol rate (e.g., the BPSK/QPSK symbol rate). In some cases, especially for high-rate systems, the bandwidth may be much lower (0.1-0.001% of the symbol rate). It can be recalled that an AGC circuit is composed of a power detector and a loop filter (or averager). With a loop bandwidth less than 1% of the symbol rate, the averaging performed by the filter may span at least 100 symbols. Typically, sampling is performed a rate much higher than the symbol rate, meaning that some thousands of samples are involved in the averaging process. A "fast" AGC may be characterized as an AGC loop with a loop bandwidth greater than about 5-10% of the symbol rate. Here, the averaging window is on the order of tens of symbols rather than hundreds of symbols as in the case of a slow AGC.

The averager 100 of FIG. 16 may be a fairly slow averager, spanning some hundreds of symbols and, thus the averager 100 can be characterized as spanning upwards of about 100 symbols of the Fast AGC 87 command signal.

When a jamming or fading event occurs, the AGC 87 adapts rapidly to a new gain level that differs from the typical level maintained by the averager 100. The difference between the long-term average gain value and the current gain value, z, is compared with a threshold by comparator 90. If the difference is larger than the threshold, an erasure is declared via delay 88 and the output multiplexer 78. The number of AGC samples considered by the averager 100 may be fixed, or it may be variable (programmable).

The circuit embodiments shown in FIGS. 13-16 are only four examples of possible circuit embodiments to detect jamming and/or fading events, and the teachings of this invention are not intended to be limited to only these techniques. Further, all or some of the disclosed circuitry could be replaced by a suitable programmed digital signal processor.

In those applications where the block fading is deterministic, such as being due to, for example, receiving the signal through the rotor of a helicopter, it is within the scope of this invention to coordinate the erasure declarations with the times the rotor is known to be obstructing the received signal. By providing the receiver with information about the positions of the rotor blades, it becomes possible to declare erasures without observing the AGC, although the AGC techniques shown in FIGS. 14-16 have the advantage that they can detect jamming as well as rotor-induced fading.

Figure 17:
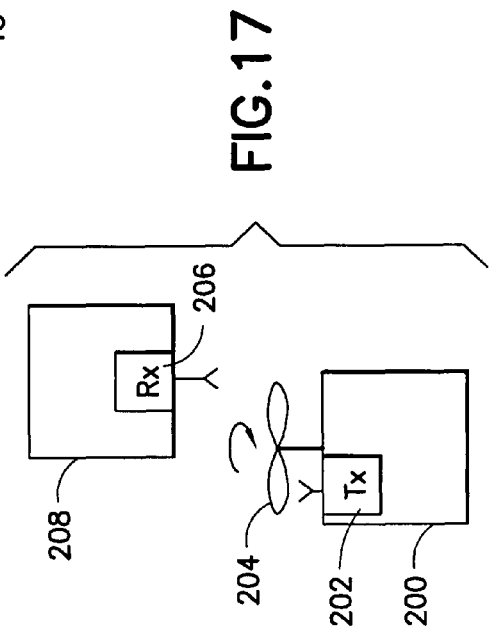
FIG. 17 shows an exemplary embodiment where the transmitter is aboard a first platform having a rotating propeller blade, and where the receiver in accordance with this invention is aboard another platform.

FIG. 17 shows an exemplary embodiment where the transmitter 202 is aboard a first platform 200 having a rotating propeller blade 204 (such as a helicopter), and where the receiver 206 in accordance with this invention is aboard another platform 208, such as a satellite or an aircraft at a higher elevation that the first platform 200.

A digital communications system design has been disclosed to combat severe block-based signal attenuation or burst jamming. The system employs a concatenated coding scheme, such as turbo codes or RS/CC and uses channel interleaving. The teachings of this invention can be used in systems that employ Turbo product codes and, in general, in systems that employ a soft decision decoder. At the receiver, severe block-bases signal attenuation or burst jamming is detected and used to improve decoder performance. For turbo decoding, knowledge of the extreme channel conditions is used to "erase" portions of the information. The results of simulations presented above show that with erasures and interleaving, significant portions of a turbo codeword can be impacted with a minimum degradation in performance. Specifically, it was found that with 20% of the codeword degraded, only a 2.5 dB performance loss was observed relative to an AWGN channel. This is in comparison to the extremely undesirable irreducible error floor that occurs when interleaving and detection are not employed. While simulations used perfect knowledge of the extreme channel events, various embodiments of circuits were disclosed for estimating or detecting these events.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalent transmitter and receiver architectures, encoder and decoders, and signal modulation formats may be attempted by those skilled in the art. However, all such and similar modifications of the teachings of this invention will still fall within the scope of this invention.

Further, while the method and apparatus described herein are provided with a certain degree of specificity, the present invention could be implemented with either greater or lesser specificity, depending on the needs of the user.

Further still, some of the features of the present invention could be used to advantage without the corresponding use of other features. As such, the foregoing description should be considered as merely illustrative of the principles of the present invention, and not in limitation thereof.

What is claimed is:

1. A method to operate a digital signal receiver, comprising:
    detecting occurrence of a symbol degrading event for a received signal, wherein the symbol degrading event occurs after transmission and before reception of the received signal, wherein detecting further comprises:
        multiplexing a received symbol stream by a multiplexor and outputting a block of L contiguous parallel symbols to a signal to noise ratio (SNR) estimator, where L is an integer greater than or equal to one;
        estimating a SNR of the block of L contiguous parallel symbols;
        comparing the estimated SNR to a threshold SNR value;
        applying a comparison result as a control signal and a delayed received symbol stream to a symbol multiplexor; and
        providing an output of the symbol multiplexor for error correction decoding;
    inserting zero symbols into the received symbol stream to replace symbols degraded by the signal degrading event prior to de-interleaving the received signal, wherein inserting further comprises replacing by the symbol multiplexor the block of L contiguous parallel symbols with L zero symbols in response to the estimated SNR being less than the threshold SNR value; and
    performing the error correction decoding of the received symbol stream having the inserted zero symbols.

2. A method as in claim 1, where error correction decoding comprises operating a Reed-Solomon decoder.

3. A method as in claim 1, where error correction decoding comprises operating a BCH decoder.

4. A method as in claim 1, where error correction decoding comprises operating a Turbo decoder.

5. A method as in claim 1, where inserting occurs in conjunction with operating a BPSK bit metric calculator.

6. A method as in claim 1, where inserting occurs after a Viterbi decoder.

7. A method as in claim 1, where error correction decoding comprises first de-interleaving the received symbol stream having the inserted zero symbols.

8. A method as in claim 1, where detecting uses information received from a transmitter that is indicative of a time when a deep fade occurs.

9. A digital signal receiver, comprising:
    circuitry configured to detect the occurrence of a symbol degrading event for a received signal, the circuitry configured to detect comprising a multiplexor, a signal to noise ratio (SNR) estimator, a comparator, a delay circuit, and a symbol multiplexor, the multiplexor configured to multiplex a received symbol stream and output a block of L contiguous parallel symbols to the SNR estimator, where L is an integer greater than or equal to one, the SNR estimator configured to estimate the SNR of the block of L contiguous parallel symbols, the comparator configured to compare the estimated SNR to a threshold SNR value, the comparator and the delay circuit configured to apply a comparison result as a control signal and a delayed received symbol stream to the symbol multiplexor, and the circuitry configured to detect further configured to provide an output of the symbol multiplexor to a decoder; and
    circuitry configured to insert zero symbols into the received symbol stream to replace symbols by the symbol degrading event prior to de-interleaving the received signal, wherein the symbol degrading event occurs after transmission and before reception of the received signal, and wherein the circuitry configured to insert zero symbols comprises the symbol multiplexor configured to replace the block of L contiguous parallel symbols with L zero symbols in response to the estimated SNR being less than the threshold SNR value; and
    the decoder configured to decode the received symbol stream having the inserted zero symbols.

10. A digital signal receiver as in claim 9, where the decoder comprises a Reed-Solomon decoder.

11. A digital signal receiver as in claim 9, where the decoder comprises a BCH decoder.

12. A digital signal receiver as in claim 9, where the decoder comprises a Turbo decoder.

13. A digital signal receiver as in claim 9, where said circuit inserts the zero symbols in conjunction with operation of a BPSK bit metric calculator.

14. A digital signal receiver as in claim 9, where said circuit inserts the zero symbols after a Viterbi decoder.

15. A digital signal receiver as in claim 9, further comprising a de-interleaver for de-interleaving the received symbol stream having the inserted zero symbols.

16. A digital signal receiver as in claim 9, where said circuit uses information received from a transmitter that is indicative of a time when a deep fade occurs.

17. A method to receive a signal that passes through a channel that is periodically obstructed by a rotating propeller blade, comprising:
    detecting occurrence of a fading condition due to obstruction by the propeller blade, wherein detecting further comprises:
        multiplexing a received symbol stream by a multiplexor and outputting a block of L contiguous parallel symbols to a signal to noise ratio (SNR) estimator, where L is an integer greater than or equal to one;
        estimating a SNR of the block of L contiguous parallel symbols;
        comparing the estimated SNR to a threshold SNR value;
        applying a comparison result as a control signal and a delayed received symbol stream to a symbol multiplexor; and
        providing an output of the symbol multiplexor for the de-interleaving;
    in response to detecting the occurrence of the fading condition, inserting zero symbols into the received symbol stream at the receiver to replace symbols degraded by the fading condition caused by the obstructing propeller blade, wherein inserting further comprises replacing by the symbol multiplexor the block of L contiguous parallel symbols with L zero symbols in response to the estimated SNR being less than the threshold SNR value;

de-interleaving the received symbol stream having the inserted zero symbols; and decoding the received symbol stream having the inserted zero symbols.

18. A method as in claim 17, where decoding comprises operating a concatenated forward error correction (FEC) decoder.

19. A method as in claim 17, where decoding comprises operating one of a Reed-Solomon decoder, a BCH decoder, or a Turbo decoder.

20. A method to operate a satellite to receive a signal that passes through a channel that is periodically obstructed by a rotating propeller blade, comprising:

detecting, on the satellite, occurrence of a fading condition due to obstruction by the propeller blade, wherein detecting further comprises:

multiplexing a received symbol stream by a multiplexor and outputting a block of L contiguous parallel symbols to a signal to noise ratio (SNR) estimator, where L is an integer greater than or equal to one;

estimating a SNR of the block of L contiguous parallel symbols;

comparing the estimated SNR to a threshold SNR value;

applying a comparison result as a control signal and a delayed received symbol stream to a symbol multiplexor; and providing an output of the symbol multiplexor for de-interleaving;

in response to detecting the occurrence of the fading condition, inserting zero symbols into the received symbol stream at the satellite to replace symbols degraded by the fading condition caused by the obstructing propeller blade, wherein inserting further comprises replacing by the symbol multiplexor the block of L contiguous parallel symbols with L zero symbols in response to the estimated SNR being less than the threshold SNR value;

de-interleaving the received symbol stream having the inserted zero symbols; and error correction decoding the received symbol stream having the inserted zero symbols.

21. A satellite, comprising:

a receiver for receiving a signal that passes through a channel that is periodically obstructed, the receiver comprising:

circuitry configured to detect occurrence of a fading condition due to an obstruction, the circuitry configured to detect comprising a multiplexor, a signal to noise ratio (SNR) estimator, a comparator, a delay circuit, and a symbol multiplexor, the multiplexor configured to multiplex a received symbol stream and output a block of L contiguous parallel symbols to the SNR estimator, where L is an integer greater than or equal to one, the SNR estimator configured to estimate the SNR of the block of L contiguous parallel symbols, the comparator configured to compare the estimated SNR to a threshold SNR value, the comparator and delay circuit configured to apply a comparison result as a control signal and a delayed received symbol stream to the symbol multiplexor, and the circuitry configured to detect further configured to provide an output of the symbol multiplexor to an error correction decoder;

circuitry configured, in response to detecting the occurrence of the fading condition, to insert zero symbols into the received symbol stream to replace symbols corrupted by the fading condition caused by the periodic obstruction, and wherein the circuitry configured to insert zero symbols comprises the symbol multiplexor configured to replace the block of L contiguous parallel symbols with L zero symbols in response to the estimated SNR being less than the threshold SNR value; and the error correction decoder configured to decode the received symbol stream having the inserted zero symbols.

* * * * *